(12) United States Patent
Hudlow et al.

(10) Patent No.: US 10,700,696 B1
(45) Date of Patent: Jun. 30, 2020

(54) ADAPTIVE CONTROL CIRCUIT AND METHOD FOR SIGNAL-OPTIMIZED SAMPLING

(71) Applicant: RAYTHEON COMPANY, Waltham, MA (US)

(72) Inventors: John Hudlow, Richardson, TX (US); Tuan M. Tong, Frisco, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/388,690

(22) Filed: Apr. 18, 2019

(51) Int. Cl.
*H03M 1/12* (2006.01)
*H03L 7/091* (2006.01)

(52) U.S. Cl.
CPC ............ *H03M 1/126* (2013.01); *H03L 7/091* (2013.01)

(58) Field of Classification Search
CPC ............................... H03M 1/126; H03L 7/091
See application file for complete search history.

(56) References Cited

U.S. PATENT DOCUMENTS

| | | |
|---|---|---|
| 5,162,723 A | 11/1992 | Marzalek et al. |
| 5,786,778 A | 7/1998 | Adams et al. |
| 5,963,160 A | 10/1999 | Wilson et al. |
| 6,016,080 A | 1/2000 | Zuta et al. |
| 6,107,947 A | 8/2000 | Lyden |
| 6,252,464 B1 | 6/2001 | Richards et al. |
| 7,158,045 B1 | 1/2007 | Gudmunson et al. |
| 7,176,817 B2 | 2/2007 | Jensen |
| 7,336,748 B2 | 2/2008 | Messier |
| 7,599,678 B2 | 10/2009 | Fisher |
| 7,733,424 B2 | 6/2010 | Hayden et al. |
| 7,809,346 B2 | 10/2010 | Risbo et al. |
| 8,477,056 B2 | 7/2013 | Sun et al. |
| 8,570,851 B2 | 10/2013 | McLeod et al. |
| 8,755,868 B2 * | 6/2014 | Yazicioglu ........... A61B 5/0428 600/509 |
| 8,830,107 B1 | 9/2014 | Karthaus |
| 8,849,226 B2 | 9/2014 | Bruchner |
| 9,323,226 B1 | 4/2016 | Waltari |
| 9,461,660 B2 | 10/2016 | Muhammad et al. |
| 2018/0269884 A1 | 9/2018 | Lesso |

OTHER PUBLICATIONS

Straayer et al., "A 12-Bit, 10-MHz Bandwidth, Continuous-Time EA ADC With a 5-Bit, 950-MS/s VCO-Based Quantizer" IEEE, Apr. 2008, IEEE Journal of Solid-State Circuits, vol. 43, No. 4, pp. 805-814.

* cited by examiner

*Primary Examiner* — Dinh T Le
(74) *Attorney, Agent, or Firm* — Lewis Roca Rothgerber Christie LLP

(57) ABSTRACT

A control circuit for signal sampling of an analog RF signal includes: a spectrum monitoring circuit for monitoring the analog RF signal to determine a frequency of the analog RF signal; a tunable clock source for generating a tunable sampling clock for sampling the analog RF signal; a sample clock tuning circuit for controlling the tunable clock source and selecting a sample clock frequency of the tunable sampling clock that provides a predetermined ratio between the sample clock frequency of the tunable sampling clock and a center frequency of the analog RF signal; and an Analog-to-Digital Converter (ADC) for sampling the analog RF signal using the tunable sampling clock.

17 Claims, 4 Drawing Sheets

ADAPTIVE CONTROL CIRCUIT AND METHOD FOR SIGNAL-OPTIMIZED SAMPLING

FIELD OF THE INVENTION

The disclosed invention relates generally to electronic circuits and more specifically to dynamic sampling control for Analog-to-Digital Converters.

BACKGROUND

An Analog-to-Digital Converter (ADC) converts a continuous analog signal at its input and quantizes the analog signal into a set of discrete levels by sampling the input analog signal at a (typically, a constant) sampling rate, by a sample clock. Many mixed signal systems entail ADCs to digitally process an analog input signal for digital processing.

Practical ADCs introduce spurious products and noise to the measured data that are deterministically related to the ratio of the input signal frequency and the sample clock. An ADC sampling at a given rate has regions of the input frequency spectrum that are optimal for in-band Spurious-free dynamic range (SFDR), and other regions for which many of the spurs fall within the band of interest. SFDR is the strength ratio of the fundamental signal to the strongest spurious signal in the output. It is also a key parameter used to specify ADCs and digital-to-analog converters (DACs).

Moreover, a ADC typically includes a comparator, the settling time of which that is needed to compare the input analog signals is not constant, but varies greatly depending on the difference between the input and the feedback signal. Typically, the settling time of the comparator is greatly dependent on its gain-bandwidth, for instance, the settling time of the comparator is short for large differences between the input signal and the feedback signal of an ADC.

Some prior approaches to address these problems with ADCS include suppressing the noise and deterministic spurious signal with added signal processing circuits or choosing a specific frequency plan and sample rate to place the operating band within favorable region for the ADC spurious performance, which requires an additional conversion stage.

Accordingly, there is a need for a control circuit that provides a mechanism for a control circuit to dynamically tune an ADC sample clock to optimize the performance of the ADCs for the signal received in real time.

SUMMARY

In some embodiments, the disclosed invention is an electronic circuit including an ADC that has been characterized to find ratios of input frequency to clock frequency yielding the best narrow-band spurious and noise performance.

In some embodiments, the disclosed invention is a control circuit for signal sampling of an analog RF signal that includes: a spectrum monitoring circuit for monitoring the analog RF signal to determine a frequency of the analog RF signal; a tunable clock source for generating a tunable sampling clock for sampling the analog RF signal; a sample clock tuning circuit for controlling the tunable clock source and selecting a sample clock frequency of the tunable sampling clock that provides a predetermined ratio between the sample clock frequency of the tunable sampling clock and a center frequency of the analog RF signal; and an Analog-to-Digital Converter (ADC) for sampling the analog RF signal using the tunable sampling clock.

In some embodiments, the disclosed invention is a method for signal sampling of an analog radio frequency (RF) signal. The method includes: monitoring the analog RF signal to determine a frequency of the analog RF signal; generating a tunable sampling clock for sampling the analog RF signal; controlling the tunable clock source and selecting a sample clock frequency of the tunable sampling clock that provides a predetermined ratio between the sample clock frequency of the tunable sampling clock and a center frequency of the analog RF signal; and sampling the analog RF signal using the tunable sampling clock.

In some embodiments, the ADC samples the analog RF signal using the tunable sampling clock by maintaining the predetermined ratio between the sample clock frequency of the tunable sampling clock and the center frequency of the analog RF signal. In some embodiments, the predetermined ratio between the sample clock frequency of the tunable sampling clock and a center frequency of the analog RF signal is stored in a clock table.

In some embodiments, the tunable clock source is a Direct Digital Synthesizer (DDS) or a Voltage-Controlled Oscillator (VCO) and is continuously variable or is tuned in steps.

BRIEF DESCRIPTION OF THE DRAWINGS

These and other features, aspects, and advantages of the disclosed invention will become better understood with regard to the following description, appended claims, and accompanying drawings.

DETAILED DESCRIPTION

In some embodiments, the disclosed invention is an electronic circuit including an ADC that maintains a ratio between the frequency of the sample clock and the center frequency of the input analog signal that optimizes ADC performance, especially spurious performance. In some embodiments, the disclosed invention takes advantage of the frequency-dependent performance of ADCs to match the sample clock to the input signal to obtain better performance over a wide band than is possible using the device in the conventional fixed-clock manner. In some embodiments, the disclosed invention uses spectral monitoring sensors that are becoming available in small, low-power packages, and a control loop that offers a low-latency adaptive sampling without the system complexity of random or non-uniform sampling.

Figure 1:
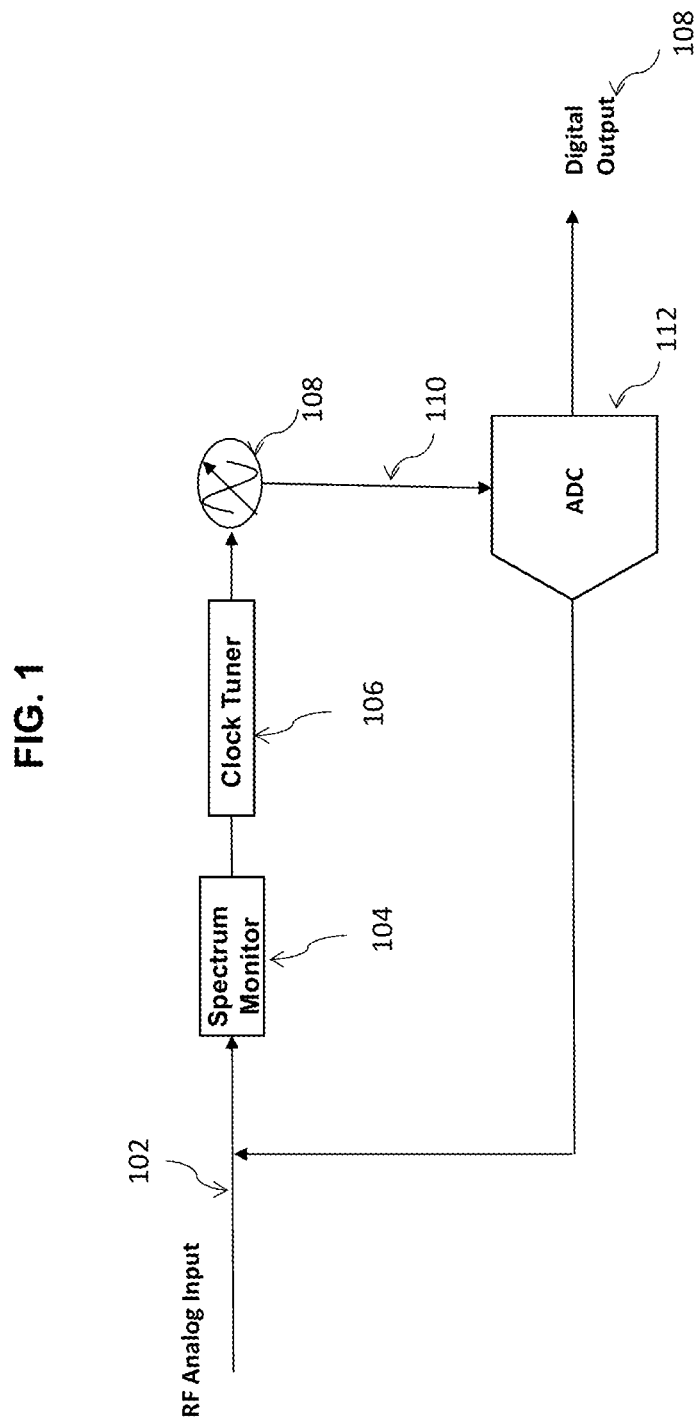
FIG. 1 is a simplified block diagram of an adaptive sampling control system, according to some embodiments of the disclosed invention.

FIG. 1 is a simplified block diagram of an adaptive sampling control system, according to some embodiments of the disclosed invention. As shown, an analog RF input signal 102 is input to an ADC 112 to be digitized. The RF signal 102 is also input to a spectrum monitoring circuit 104, including an analog fast Fourier transform (FFT) circuit to monitor the input RF signal 102 to determine its approximate frequency, as described below with respect to FIG. 2. A Fourier transform (FT) circuit decomposes a signal that is a function of time into its frequency components and converts the signal from its original domain (time or space) to a representation in the frequency domain. A fast Fourier transform (FFT) circuit computes the discrete Fourier transform (DFT) of a sequence, or its inverse (IDFT).

A continuously tunable clock source 108, for example, a Direct Digital Synthesizer (DDS) or a Voltage-Controlled Oscillator (VCO) supplies the tunable sampling clock 110 to the ADC 112. The tunable clock source 108 may be continuously variable or tuned in small steps. A sample clock tuning circuit 106 controls and selects a sample clock frequency of the clock source 108 that results in an optimal ratio between the frequency of the sample clock and the center frequency of the input signal. The control logic of the sample clock tuning circuit 106 determines the frequency of the peak input signal and sets the sample clock rate to place the input near an optimized ratio. This way, the ADC 112 is characterized to find ratios of input frequency to clock frequency yielding the best narrow-band spurious and noise performance.

ADC 112 produces spurious products whose frequencies are deterministically related to the ratio of the sampled signal frequency and the sample clock frequency. Thus the ratio of these two frequencies determines whether spurious products fall within the signal bandwidth or outside the signal bandwidth where they can be more easily filtered in DSP. In addition, the amplitude of the spurious products is often frequency dependent as well, so that for an optimized ratio of input frequency to sample clock frequency, the spurious performance can be improved across the entire sampling frequency spectrum.

In some embodiments, a DDS circuit (known in the art) is used as the clock source 108 to vary the sample clock frequency, where control words for the DDS are provided by the sample clock tuning circuit 106, based on the center frequencies of the input signal 102. These control words are binary equivalents of the center frequencies of the input signal 102, such as 10 MHz, 20 MHz, etc. In some embodiments, the DDS circuit generates a sample clock 110 (e.g., sinewave) according to parameters (e.g. a selected frequency) set by sample clock tuning circuit 106. In some embodiments, the sample clock tuning circuit 106 may include a processor, memory (e.g., RAM and ROM) and I/O circuitry. The tuning circuit may also be implemented in programmable logic such as a field programmable gate array (FPGA) with firmware to realize the desired tuning function.

In some embodiments, it may be possible to select from multiple favorable ratios to accommodate other device or system constraints. If the signal bandwidth is narrow, then favorable ratios may exist that place spurious products on one side of the signal band or on the other. Favorable ratios may include a substantial continuous range of input signal for the same clock frequency (such as a 20% fractional bandwidth) or a comparatively narrow range (such as a 2% fractional bandwidth) depending on the application.

Figure 2:
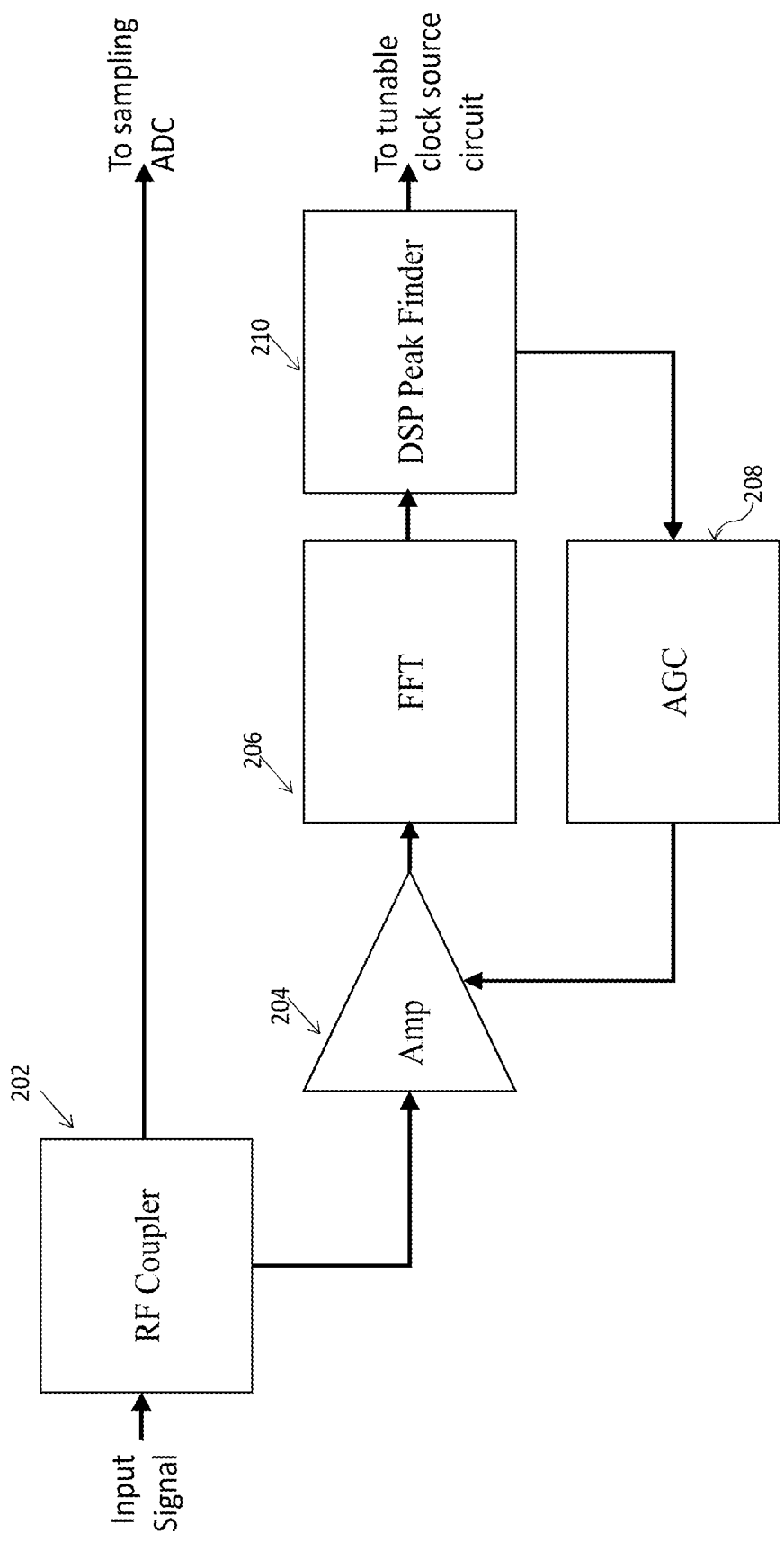
FIG. 2 is a simplified block diagram of an exemplary spectrum monitoring circuit, according to some embodiments of the disclosed invention.

FIG. 2 is a simplified block diagram of an exemplary spectrum monitoring circuit, according to some embodiments of the disclosed invention. As shown, an RF decoupler circuit 202 decouples the analog RF input signal ("Input Signal") and passes most of the Input Signal power to the sampling ADC (12 of FIG. 1) with minimum loss and distortion, while also providing Input Signal to an amplifier 204. The amplifier 204 adjusts the signal power to an appropriate level for an FFT 206 circuit to provide a real-time low latency frequency spectrum representation of the Input Signal. In some embodiments, a low-latency analog FFT circuit provides spectral information to the control block with minimal DSP and low delay, thus facilitating rapid adaptation of the sample clock to a changing input signal.

A digital signal processing (DSP) peak finder circuit 210 determines the amplitude and frequency of the major peaks in the signal frequency spectrum. The input to the DSP is a spectrum represented as an array of amplitudes at discretized frequencies. The peak finder circuit 210 then processes this input and provides the amplitude and frequency of one or more bins at which the amplitude is higher than the ones in other bins. This output is then used by the tunable clock source circuit to determine for which input frequencies to optimize for the ADC sample clock. The output of the DSP peak finder circuit 210 is fed to a tunable clock source (e.g., circuit 108 of FIG. 1) and an automatic gain controller (AGC) circuit 208. AGC 208 uses peak amplitude to adjust the gain level of the amplifier 204 so that the FFT circuit receives an input amplitude that maximizes its dynamic range and the accuracy of the information provided to the peak finder circuit 210. In some embodiments, the spectrum monitoring circuit may also include a second, low-latency ADC (not shown) between the FFT circuit 206 and the DSP peak finder circuit 210.

Figure 3:
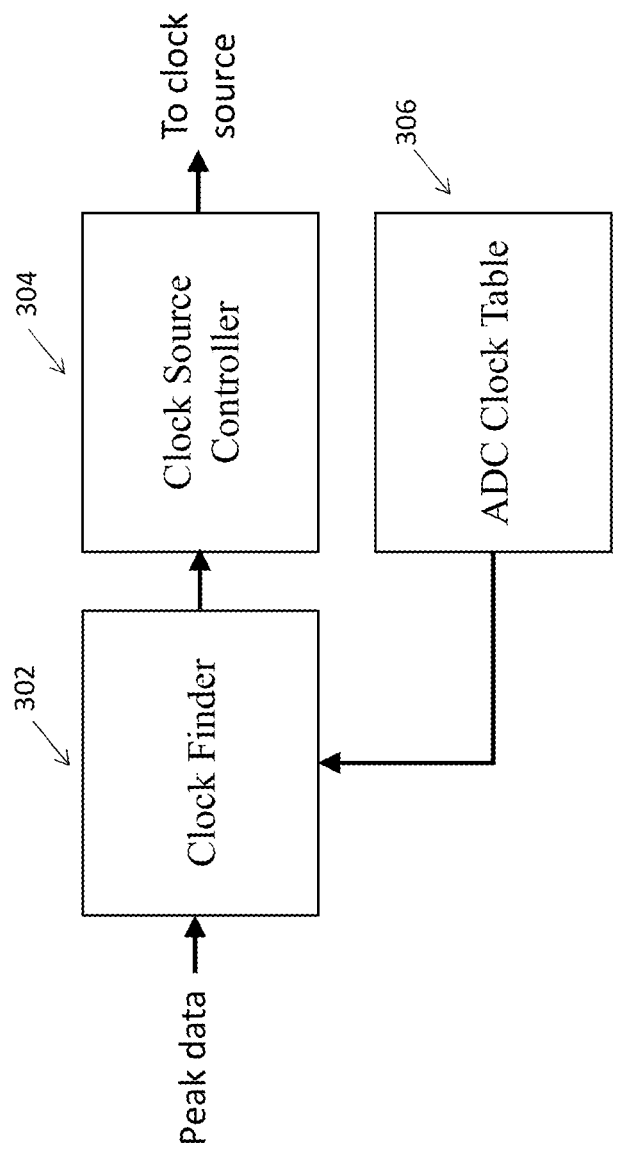
FIG. 3 is a simplified block diagram of an exemplary clock tuning circuit, according to some embodiments of the disclosed invention.

FIG. 3 is a simplified block diagram of an exemplary clock tuning circuit, according to some embodiments of the disclosed invention. As illustrated, an ADC clock table 306 stores (in a storage device) a map specific to the ADC and frequency band of interest and thus mapping input frequencies to optimal sample clock frequencies. This map may be generated as part of the system design, using ADC sampling theory and empirical measured data. In some embodiments, the ADC clock table 306 may be implemented using EEPROM or other non-volatile memory devices. In some embodiments, the map could be calibrated in the system as part of a system calibration using known training signals to test spurious performance.

A clock finder circuit 302 uses the ADC clock table 306 and the peak data (from DSP peak finder 210 of FIG. 2) to choose the sample clock frequency that best optimizes sampling for the peaks in the input RF signal frequency spectrum. In some embodiments, this function may be implemented in firmware or software. The software or firmware process receives the peak frequencies of the peaks identified by the peak finder circuit and then makes a determination about which sample clock frequency is closest to optimal performance, using the clock table data. In some embodiments, the software or firmware process picks the sample frequency that is optimal for the frequency of the largest peak. Depending on the application however, the process may select several peaks and choose a sample clock frequency that produces the best average, median, center and/or best minimum spurious performance for all the peaks considered. A clock source controller circuit 304 converts the clock frequency to a control word or control voltage needed to drive the clock source (108 in FIG. 1) to the selected sample clock frequency.

While the latency of the tuned ADC itself is not a limiting factor, in some embodiments, the spectrum monitoring function (e.g., of the spectrum monitoring circuit 104 of FIG. 1) may be performed using DSP logic that performs an FFT on the data sampled by the tuned ADC, and combines the FFT spectrum with the instantaneous sample frequency of the tuned ADC (112) to find the input frequency for the sample clock tuning circuit 106. This is due to the fact that the tuned ADC produces digital data that could be fed directly to the DSP peak finder block of the spectrum monitoring circuit, thus making the other components of the peak finder circuit unnecessary for some applications.

Figure 4:
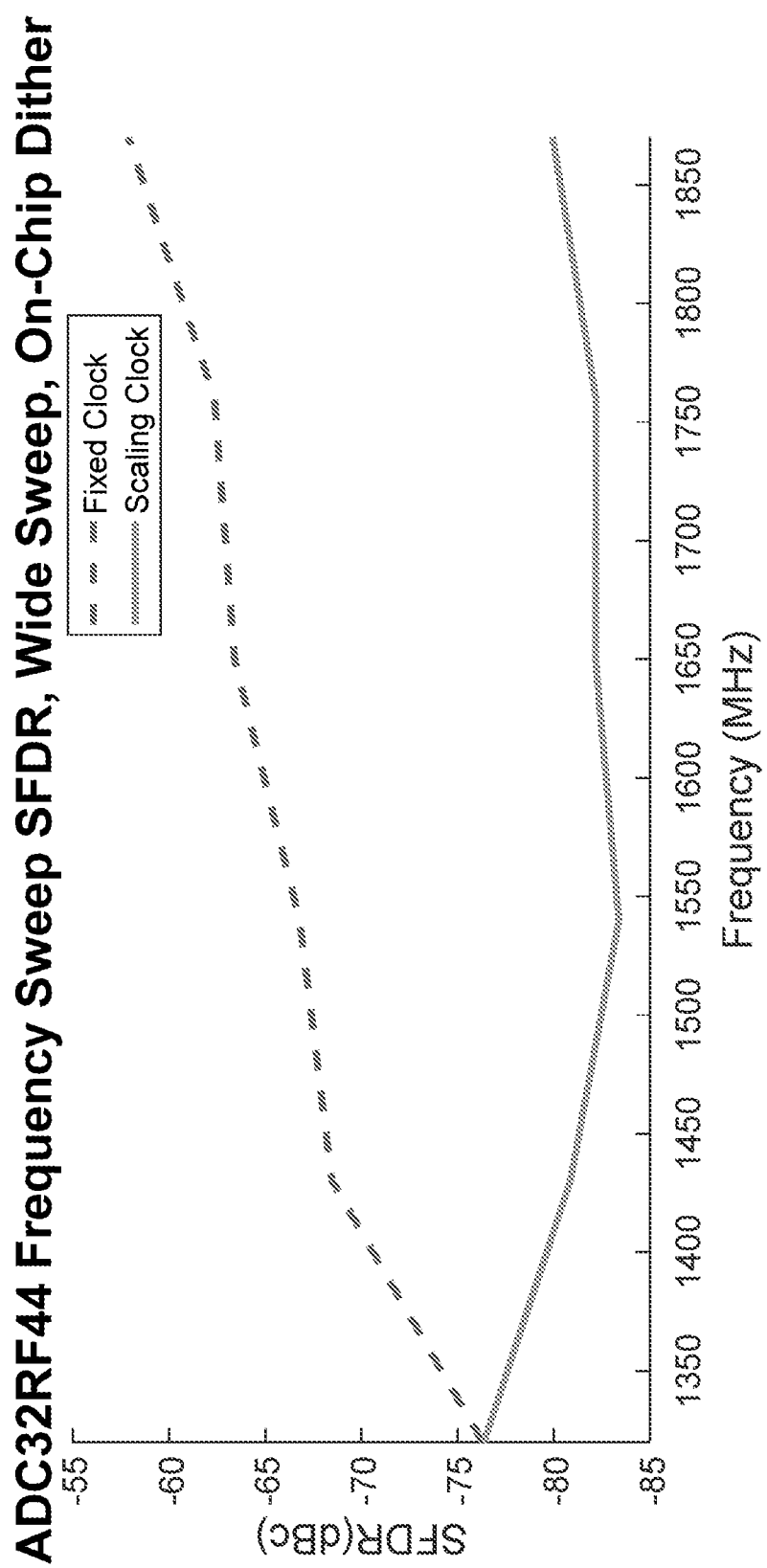
FIG. 4 is a chart illustrating the SFDR over frequency for a fixed clock, and a scaling (tunable) clock according to some embodiments of the disclosed invention.

FIG. 4 is a chart illustrating the SFDR over frequency for a fixed clock, and a tunable clock according to some embodiments of the disclosed invention. In this case, the fixed clock data is taken with a sample clock fixed at 1920 MHz. The SFDR is then measured with the input frequency swept across most of second Nyquist zone (990-1870 MHz). As depicted, the best SFDR is at 1320 MHz. The scaling (tunable) clock data is also taken at same input frequencies, with sample clock frequency scaled to force a uniform ratio of sample clock to input tone (i.e., 1920/1320=16/11). In this experiment, this clock frequency was scaled by manually changing the clock frequency to maintain the optimal ratio of 16/11 relative to the input tone, but in the proposed invention this setting of the sample clock frequency would be done automatically in real time. As shown there is lower SFDR over a wider range for the tunable clock of the disclosed invention.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims

The invention claimed is:

1. A control circuit for signal sampling of an analog radio frequency (RF) signal comprising:
   a spectrum monitoring circuit for monitoring the analog RF signal to determine a frequency of the analog RF signal;
   a tunable clock source for generating a tunable sampling clock for sampling the analog RF signal;
   a sample clock tuning circuit for controlling the tunable clock source to select a frequency of the tunable sampling clock that provides a predetermined ratio between the selected frequency of the tunable sampling clock and a center frequency of the analog RF signal; and
   an Analog-to-Digital Converter (ADC) for sampling the analog RF signal using the selected frequency of the tunable sampling clock.

2. The control circuit of claim 1, wherein the ADC samples the analog RF signal using the tunable sampling clock by maintaining the predetermined ratio between the selected frequency of the tunable sampling clock and the center frequency of the analog RF signal.

3. The control circuit of claim 1, wherein the tunable clock source is a Direct Digital Synthesizer (DDS).

4. The control circuit of claim 1, wherein the tunable clock source is a Voltage-Controlled Oscillator (VCO).

5. The control circuit of claim 1, wherein the tunable clock source is continuously variable or is tuned in steps.

6. The control circuit of claim 1, wherein the predetermined ratio between the selected frequency of the tunable sampling clock and the center frequency of the analog RF signal is stored in a clock table.

7. The control circuit of claim 6, wherein the clock table comprises of a map specific to the ADC and a frequency band of interest to map frequencies of the analog RF signal to optimal sample clock frequencies.

8. The control circuit of claim 1, wherein the sample clock tuning circuit includes a processor, a memory and I/O circuitry.

9. The control circuit of claim 1, wherein the sample clock tuning circuit is implemented in a field programmable gate array (FPGA) with firmware.

10. The control circuit of claim 1, wherein the spectrum monitoring circuit comprises:
    an RF decoupler circuit for decoupling the analog RF signal to the ADC and to an amplifier;
    a fast Fourier transform (FFT) circuit coupled to the amplifier for generating a real-time low latency frequency spectrum representation of the analog RF signal, wherein the amplifier adjusts a signal power of the analog RF signal;
    a digital signal processing (DSP) peak finder circuit coupled to the FFT circuit for determining an amplitude and a frequency of major frequency peaks in frequency spectrum of the analog RF signal, wherein an output of the DSP peak finder circuit is fed to the tunable clock source; and
    an automatic gain controller (AGC) circuit for adjusting a gain level of the amplifier.

11. The control circuit of claim 10, wherein the clock tuning circuit comprises:
    a clock table for storing the predetermined ratio between the selected frequency of the tunable sampling clock and the center frequency of the analog RF signal;
    a clock finder circuit for selecting the frequency of the tunable sampling clock that provides the predetermined ratio by using the clock table and an output of the DSP peak finder circuit; and
    a clock source controller circuit for converting the selected frequency of the tunable sampling clock to a control word or a control voltage to drive the tunable clock source to the selected frequency.

12. A method for signal sampling of an analog radio frequency (RF) signal, the method comprising:
    monitoring the analog RF signal to determine a frequency of the analog RF signal;
    generating a tunable sampling clock for sampling the analog RF signal;
    controlling the tunable clock source and selecting frequency of the tunable sampling clock that provides a predetermined ratio between the selected frequency of the tunable sampling clock and a center frequency of the analog RF signal; and
    sampling the analog RF signal using the selected frequency of the tunable sampling clock.

13. The method of claim 12, wherein the predetermined ratio between the selected frequency of the tunable sampling clock and the center frequency of the analog RF signal is stored in a clock table.

14. The method of claim 13, wherein the clock table comprises of a map specific to the ADC and a frequency band of interest to map frequencies of the analog RF signal to optimal sample clock frequencies.

15. The method of claim 12, wherein the tunable clock is generated by a Direct Digital Synthesizer (DDS) or a Voltage-Controlled Oscillator (VCO).

16. The method of claim 12, wherein said monitoring the analog RF signal comprises:
    decoupling the analog RF signal to the ADC and to an amplifier;

generating a real-time low latency frequency spectrum representation of the analog RF signal, wherein the amplifier adjusts a signal power of the analog RF signal;

determining an amplitude and a frequency of major frequency peaks in frequency spectrum of the analog RF signal for controlling the tunable clock source; and adjusting a gain level of the amplifier.

17. The method of claim 12, wherein the analog RF signal is sampled using the selected frequency of the tunable sampling clock by maintaining the predetermined ratio between the selected frequency and the center frequency of the analog RF signal.

\* \* \* \* \*